United States Patent [19]

Masuda et al.

[11] Patent Number: 4,916,397
[45] Date of Patent: Apr. 10, 1990

[54] SEMICONDUCTOR DEVICE WITH BONDING PAD

[75] Inventors: Hisao Masuda; Syuichi Osaka, both of Hyogo, Japan

[73] Assignee: Mitsubishi Denki Kabushiki Kaisha, Tokyo, Japan

[21] Appl. No.: 227,833

[22] Filed: Aug. 3, 1988

[30] Foreign Application Priority Data

Aug. 3, 1987 [JP] Japan ................... 62-193957

[51] Int. Cl.⁴ ........................... H01L 23/48
[52] U.S. Cl. ......................... 357/71; 357/67; 357/68; 357/65; 357/54
[58] Field of Search ............ 357/71, 71 S, 71 P, 357/67, 67 S, 68, 65, 59 R, 59 I, 54

[56] References Cited

U.S. PATENT DOCUMENTS

| | | | |
|---|---|---|---|
| 3,609,470 | 9/1971 | Kuiper | 357/67 |
| 4,566,026 | 1/1986 | Lee et al. | 357/65 |
| 4,636,832 | 1/1987 | Abe et al. | 357/71 P |

FOREIGN PATENT DOCUMENTS 60-05560  1/1985  Japan .
60-09159  1/1985  Japan .
60-57646  4/1985  Japan .

Primary Examiner—Andrew J. James
Assistant Examiner—Mark Prenty
Attorney, Agent, or Firm—Lowe, Price, LeBlanc, Becker & Shur

[57] ABSTRACT

A semiconductor device having a bonding pad for connecting lead wires comprises a semiconductor substrate, a metal silicide film, a silicon dioxide film, a metal nitride film and an aluminum film. The silicon dioxide film has an opening in a portion corresponding to the bonding pad. The metal silicide film is formed in the portion corresponding to the bonding pad on the semiconductor substrate. The metal nitride film is formed on the metal silicide film and adhered to the metal silicide film. The aluminum film is provided as a bonding pad and formed on the metal nitride film.

In a method for manufacturing the above described semiconductor device, the metal silicide film is formed on the semiconductor substrate and patterned. The silicon dioxide film is formed thereon. The opening is formed in the position corresponding to the bonding pad on the silicon dioxide film. The metal nitride film is formed in the opening. The aluminum film is formed on the metal nitride film.

6 Claims, 4 Drawing Sheets

SEMICONDUCTOR DEVICE WITH BONDING PAD

BACKGROUND OF THE INVENTION

1. Field of the Invention

The present invention relates generally to a semiconductor device and a manufacturing method therefor, and more particularly, to a semiconductor device having a bonding pad and a manufacturing method therefor.

Related co-pending applications include U.S. Application Ser. No. 146,826 now abandoned, U.S. Application Ser. No. 131,636, and International Application No. PCT/JP87/00555.

2. Description of the Prior Art

FIGS. 1 and 2 are a cross sectional view and a plan view of a bonding pad portion of this kind of conventional semiconductor device, respectively. In FIGS. 1 and 2, a field oxide film (referred to as $SiO_2$ film hereinafter) 22 is formed on a silicon substrate 21 incorporating circuit elements. A polysilicon (polycrystalline silicon) film 23 and a tungsten silicide film (referred to as WSi film hereinafter) 24 are formed on the $SiO_2$ film 22 and then, patterned. A silicon dioxide film (referred to as BPSG film hereinafter) 25 containing at least one of phosphorous and arsenic is formed on the WSi film 24. A titanium nitride film (referred to as TiN film hereinafter) 26 and an aluminum film (referred to as Al film hereinafter) 27 are formed on the BPSG film 25 by evaporation or the like.

After the TiN film 26 and the Al film 27 are patterned, an insulating protective film 28 is coated. An opening 28a is formed in a portion of the insulating protective film 28 corresponding to a bonding pad portion of the Al film 27. The Al film 27 thus exposed is used as a bonding pad, so that lead wires (not shown) formed of gold or the like are bonded.

Since the conventional semiconductor device has the foregoing structure, the following problems (1) and (2) exist.

(1) Since adhesion (joining force) between the BPSG film 25 and the TiN film 26 is weak, separation between both the films 25 and 26 is liable to occur at the time of bonding.

(2) Impurities in the BPSG film 25 (particularly, phosphorous or boron) are liable to diffuse into the Al film 27. The impurities cause initial bonding characteristics to be degraded or a gold-aluminum alloy layer to be early deteriorated at a high temperature. As a result, water can enter between the Al film and the lead wire, so that an acid is synthesized, whereby corrosion resistance is deteriorated.

The other prior art includes Japanese Patent Laying-Open Gazette Nos. 9159/1985, 5560/1985 and 57646/1985.

In Japanese Patent Laying-Open Gazette No. 9159/1985, at least one barrier layer formed of refractory metal silicide or nitride is formed in an ohmic contact region on a substrate. An aluminum film is formed on the barrier layer. In Japanese Patent Laying-Open Gazette No. 5560/1985, a barrier layer comprising a double layer of titanium nitride and titanium or a triple layer of titanium, titanium nitride and titanium is provided in a contact portion between metals as a barrier layer for preventing diffusion between the metals. In Japanese Patent Laying-Open Gazette No. 57646/1985, a metal film formed of Ti, Mo, Ta, W or the like or a silicide film thereof is formed under a contact portion or an aluminum interconnection. However, the foregoing prior art is not concerned with the bonding pad.

SUMMARY OF THE INVENTION

An object of the present invention is to provide a semiconductor device in which adhesion between a metal nitride film serving as an underlying layer of a bonding pad and a film thereunder is so strong that early separation between the metal nitride film and the film thereunder is prevented.

Another object of the present invention is to provide a semiconductor device whose reliability is improved by preventing diffusion of impurities into an aluminum film constituting a bonding pad.

Still another object of the present invention is to provide a manufacturing method for manufacturing the above described semiconductor device.

The present invention is directed to a semiconductor device having a bonding pad for connecting lead wires, which comprises a semiconductor substrate, a silicon dioxide film, a metal silicide film, a metal nitride film and an aluminum film. The silicon dioxide film is formed on the semiconductor substrate and contains elements selected from the group consisting of phosphorous and boron. In addition, the silicon dioxide film has an opening in a portion corresponding to the bonding pad. The metal silicide film is formed in the portion corresponding to the bonding pad on the semiconductor substrate. The metal nitride film is formed on the metal silicide film and adhered to the metal silicide film. The aluminum film is formed on the metal nitride film and serves as the bonding pad.

The metal silicide film is, for example, a tungsten silicide film, and the metal nitride film is, for example, a titanium nitride film.

In a method for manufacturing the semiconductor device according to the present invention, a metal silicide film is formed on a semiconductor substrate and then, patterned. A silicon dioxide film is formed to cover the semiconductor substrate and the metal silicide film. An opening is formed in a position corresponding to a bonding pad on the silicon dioxide film. A metal nitride film is formed in the opening so as to be bonded to the metal silicide film. An aluminum film serving as the bonding pad is formed on the metal nitride film.

In the semiconductor device according to the present invention, adhesion between the metal nitride film and the underlying film becomes strong. In addition, diffusion of impurities into the aluminum film is prevented.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
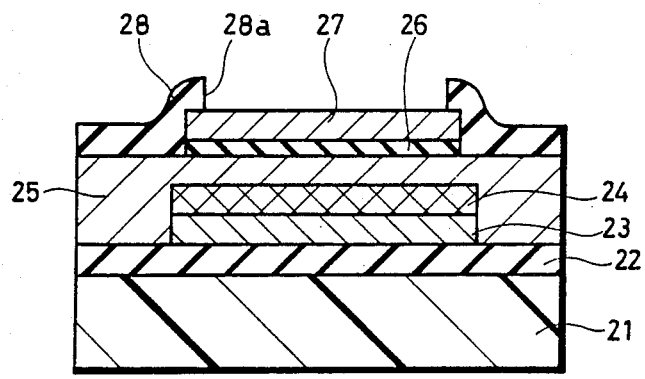
FIG. 1 is a vertical sectional view of a conventional semiconductor device.
Figure 2:
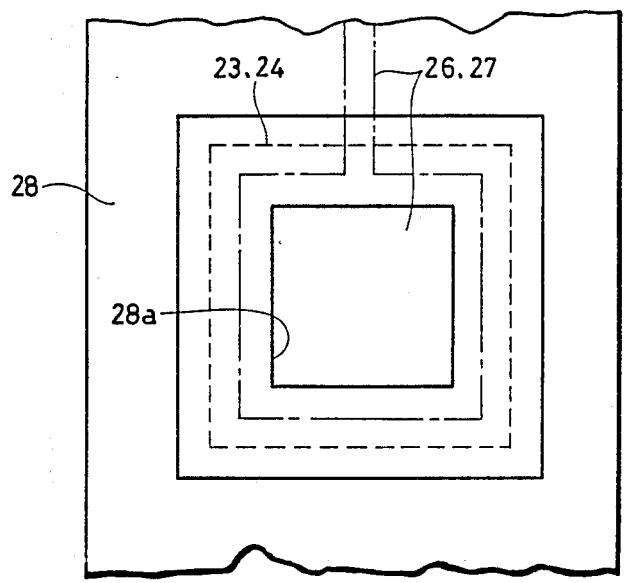
FIG. 2 is a plan view thereof.
Figure 3:
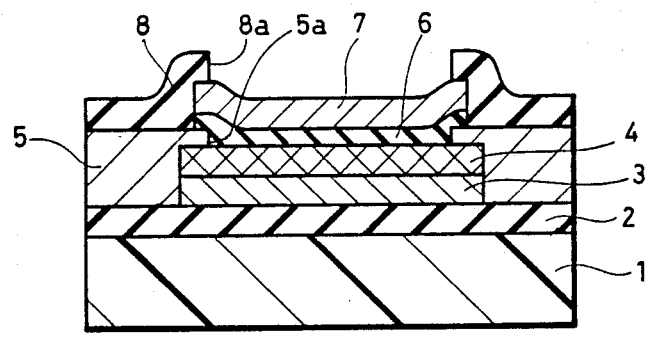
FIG. 3 is a vertical sectional view of a semiconductor device according to an embodiment of the present invention.
Figure 4:
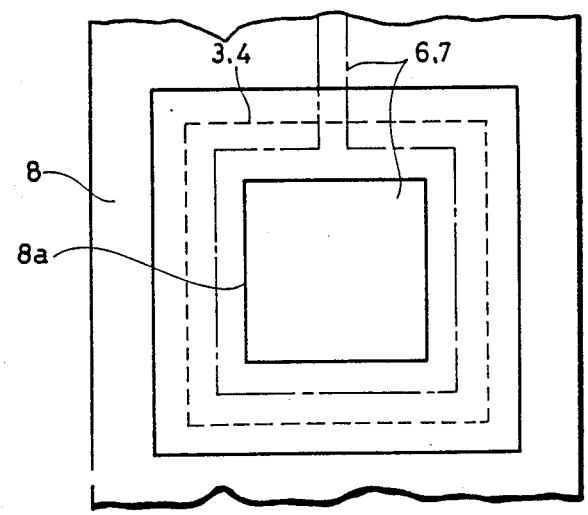
FIG. 4 is a plan view thereof.

FIG. 3 is a vertical sectional view showing a bonding pad portion of a semiconductor device according to an embodiment of the present invention, and FIG. 4 is a plan view thereof.

The semiconductor device according to the present embodiment comprises a silicon substrate 1 in a lowermost layer and an $SiO_2$ film 2 formed on the silicon substrate 1 or patterned after formation. On the $SiO_2$ film 2, a polysilicon film 3 and a WSi film 4 thereon are arranged in a position corresponding to a bonding pad as described below. The polysilicon film 3 and the WSi film 4 serve as cushioning materials of the bonding pad.

A BPSG film 5 is formed to cover the upper surface of the $SiO_2$ film 2 and the WSi film 4. An opening 5a is formed in a portion corresponding to the bonding pad of the BPSG film 5. A TiN film 6 is arranged in the opening 5a and on the BPSG film 5 around the periphery thereof, and an Al film 7 serving as the bonding pad is arranged on the TiN film 6. In addition, an insulating protective film 8 is formed on the BPSG film 5. An opening 8a is formed in a portion corresponding to the bonding pad of the film 8. Lead wires (not shown) formed of gold or the like are bonded to the Al film 7.

According to the above described embodiment, since the opening 5a is provided in the BPSG film 5 and the TiN film 6 is brought into contact with the WSi film 4, little BPSG film 5 exists under the TiN film 6, so that the contact area between the TiN film 6 and the BPSG film 5 is small. As a result, adhesion between the TiN film 6 and the underlying film, i.e., the WSi film 4 becomes strong. Furthermore, the BPSG film 5 can diffuse few impurities into the Al film 7. Consequently, the junction having strong adhesion between the TiN film 6 and the WSi film 4 is obtained instead of the junction having weak adhesion between the TiN film 6 and the BPSG film 5, so that early separation can be prevented, and degradation of the initial bonding characteristics due to impurities (particularly, phosphorous and boron) in the BPSG film 5 can be prevented. In addition, reaction between water, which enters through a film interface, and phosphorous or boron can be controlled. Additionally, diffusion of phosphorous which adversely affects a gold-aluminum alloy layer in the bonding pad portion can be controlled. Such an effect allows reliability of the semiconductor device to be maintained for a long time.

Description is now made on a method for manufacturing the semiconductor device according to the above described embodiment.

Figure 5A:
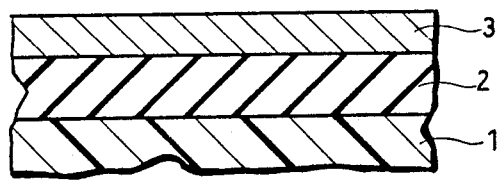
FIGS. 5A to 5G are vertical sectional views for explaining a manufacturing method therefor.

As shown in FIG. 5A, an $SiO_2$ film 2 is formed on the surface of a silicon substrate 1. In addition, a polysilicon film 3 is formed thereon.

Figure 5B:
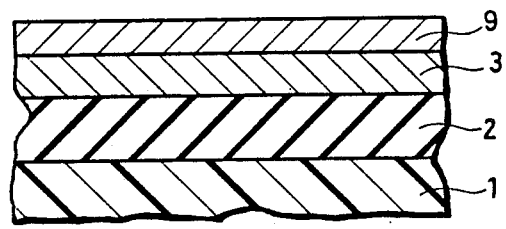
Figure 5C:
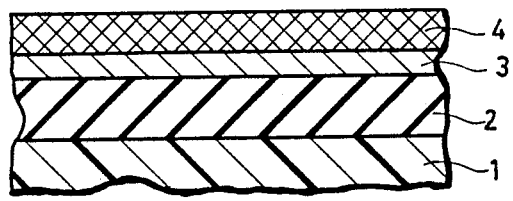

Then, a metal tungsten 9 as shown in FIG. 5B is deposited on the polysilicon film 3 by, for example, a sputtering process. Subsequently, the metal tungsten 9 reacts with the polysilicon film 3 by heat treatment, so that a WSi film 4 is formed as shown in FIG. 5C. At the time of heat treatment, it is very important to avoid the inclusion of oxygen or air in order to prevent the surface of tungsten from being oxidized. Consequently, the use of a heat-treating technique, which easily controls an atmosphere, such as a lamp annealing process is very effective.

Figure 5D:
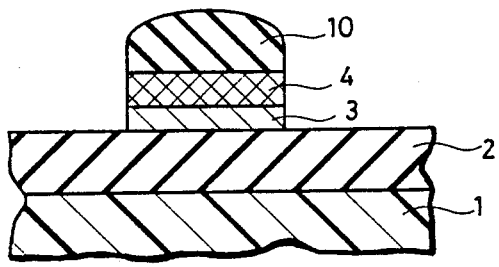

Thereafter, as shown in FIG. 5D, a resist 10 is patterned using a photolithographic technique. On this occasion, reactive ion etching is generally used to improve the controllability of a pattern width.

Figure 5E:
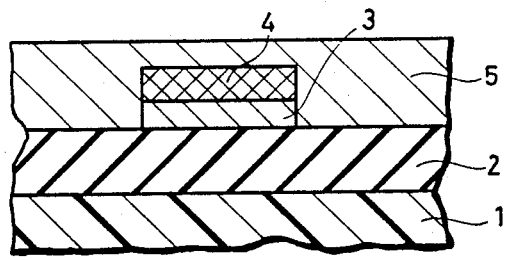
Figure 5F:
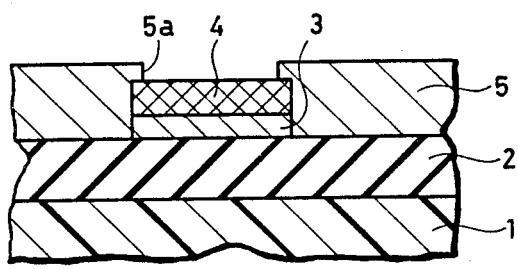
Figure 5G:
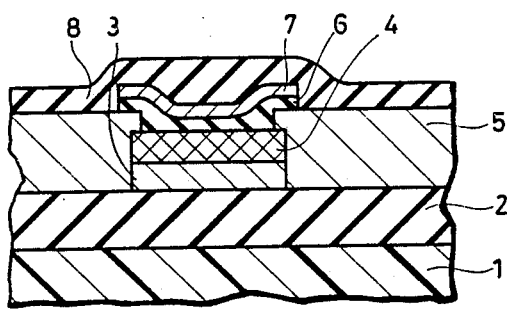

Furthermore, after the resist 10 on the WSi film 4 is removed, a BPSG film 5 is formed as shown in FIG. 5E. As shown in FIG. 5F, only a bonding pad portion of the BPSG film 5 is removed by etching, to form an opening 5a. Thereafter, a TiN film 6 and an Al film 7 are coated on the BPSG film 5 including the opening 5a. After the TiN film 6 and the Al film 7 are patterned in a predetermined shape, an insulating protective film 8 is coated thereon as shown in FIG. 5G. If a portion corresponding to the bonding pad of the film 8 is opened to form an opening 8a, the bonding pad shown in FIG. 3 is obtained.

Meanwhile, the TiN film 6 may be replaced with another refractory metal nitride such as tungsten, tantalum, zirconium and hafnium. In addition, the WSi film 4 may be replaced with another refractory metal silicide such as titanium, tantalum, zirconium and hafnium.

As described in the foregoing, according to the present invention, since no BPSG film exists under an aluminum film serving as a bonding pad and a metal nitride film, adhesion between the metal nitride film and a film thereunder is increased. In addition, since diffusion of impurities into the aluminum film can be controlled, the bonding characteristics are improved, and early deterioration of a gold-aluminum junction portion can be prevented. Thus, the reliability of a semiconductor device can be ensured for a long time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a bonding pad for connecting lead wires, comprising:
    a semiconductor substrate;
    a metal silicide film formed in a portion corresponding to said bonding pad on said semiconductor substrate,
    a silicon dioxide film formed on said semiconductor substrate and containing elements selected from the group consisting of phosphorus and boron, said silicon dioxide film having an opening in a portion corresponding to said bonding pad,
    a metal nitride film formed on said metal silicide film and adhered to said metal silicide film, and
    an aluminum film formed on said metal nitride film and serving as said bonding pad.

2. The semiconductor device according to claim 1, wherein said metal silicide film comprises a tungsten silicide film, and said nitride film comprises a titanium nitride film.

3. The semiconductor device according to claim 2, which further comprises a polycrystalline silicon film formed under said metal silicide film.

4. The semiconductor device according to claim 3, which further comprises a field oxide film formed on the upper surface of said semiconductor substrate, and wherein said silicon dioxide film and said metal silicide film are formed on the field oxide film.

5. The semiconductor device according to claim 4, which further comprises an insulating protective film formed on said silicon dioxide film, and wherein said insulating protective film has an opening in a position corresponding to the bonding pad and said aluminum film is exposed to the exterior through the opening.

6. A semiconductor device having a bonding pad for connecting lead wires, comprising:
- a semiconductor substrate;
- a metal silicide film formed on a portion of said semiconductor substrate corresponding to the location of said bonding pad;
- a silicon dioxide film formed on said semiconductor substrate and containing elements selected from the group consisting of phosphorus and boron, said silicon dioxide film having an opening corresponding to the location of said bonding pad,
- a metal nitride film formed on and adhered to said metal silicide film, and
- an aluminum film formed on said metal nitride film and serving as said bonding pad, said metal nitride film also being arranged between and preventing contact of any overlapping portions of said silicon dioxide film and said aluminum film.

* * * * *